United States Patent [19]
Born et al.

[11] 4,161,016
[45] Jul. 10, 1979

[54] SEMICONDUCTOR AND HEAT SINK ASSEMBLY

[75] Inventors: Norman E. Born; Martin A. Halttunen, both of Erie, Pa.

[73] Assignee: General Electric Company, Erie, Pa.

[21] Appl. No.: 859,837

[22] Filed: Dec. 12, 1977

[51] Int. Cl.² .............................................. H05K 7/20
[52] U.S. Cl. .................................... 361/388; 361/386; 363/141; 357/81
[58] Field of Search ................. 363/141, 144; 357/76, 357/81; 361/386, 388, 391; 174/16 HS

[56] References Cited
U.S. PATENT DOCUMENTS

| | | | |
|---|---|---|---|
| 2,921,243 | 1/1960 | Johnson | 363/141 |
| 3,435,891 | 4/1969 | Parrish | 174/16 HS |
| 3,611,107 | 10/1971 | Ruckel | 363/144 |
| 3,763,402 | 10/1973 | Shore | 357/76 |
| 4,007,402 | 2/1977 | Allport | 361/388 |

Primary Examiner—Gerald P. Tolin
Attorney, Agent, or Firm—Arnold E. Renner

[57] ABSTRACT

A semiconductor and heat sink assembly of the type having two groups of semiconductor devices only one group of which is operable at any instant in time has the semiconductor devices arranged, with respect to the heat sink portion of the assembly, in a divided manner such that maximum utilization is made of the heat sink to thereby provide improved duty cycle capabilities.

4 Claims, 6 Drawing Figures

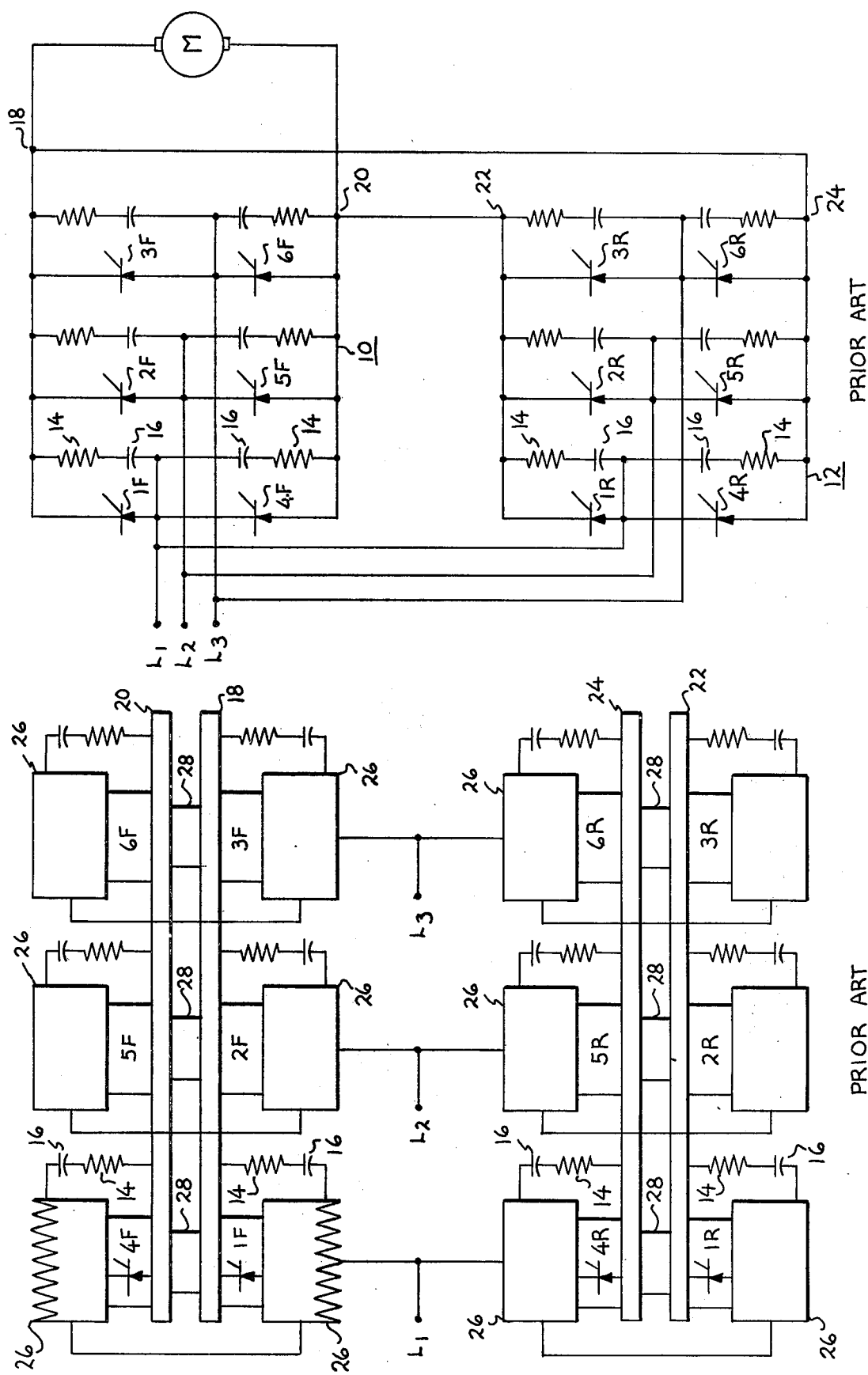
PRIOR ART FIG.1a
PRIOR ART FIG.1b

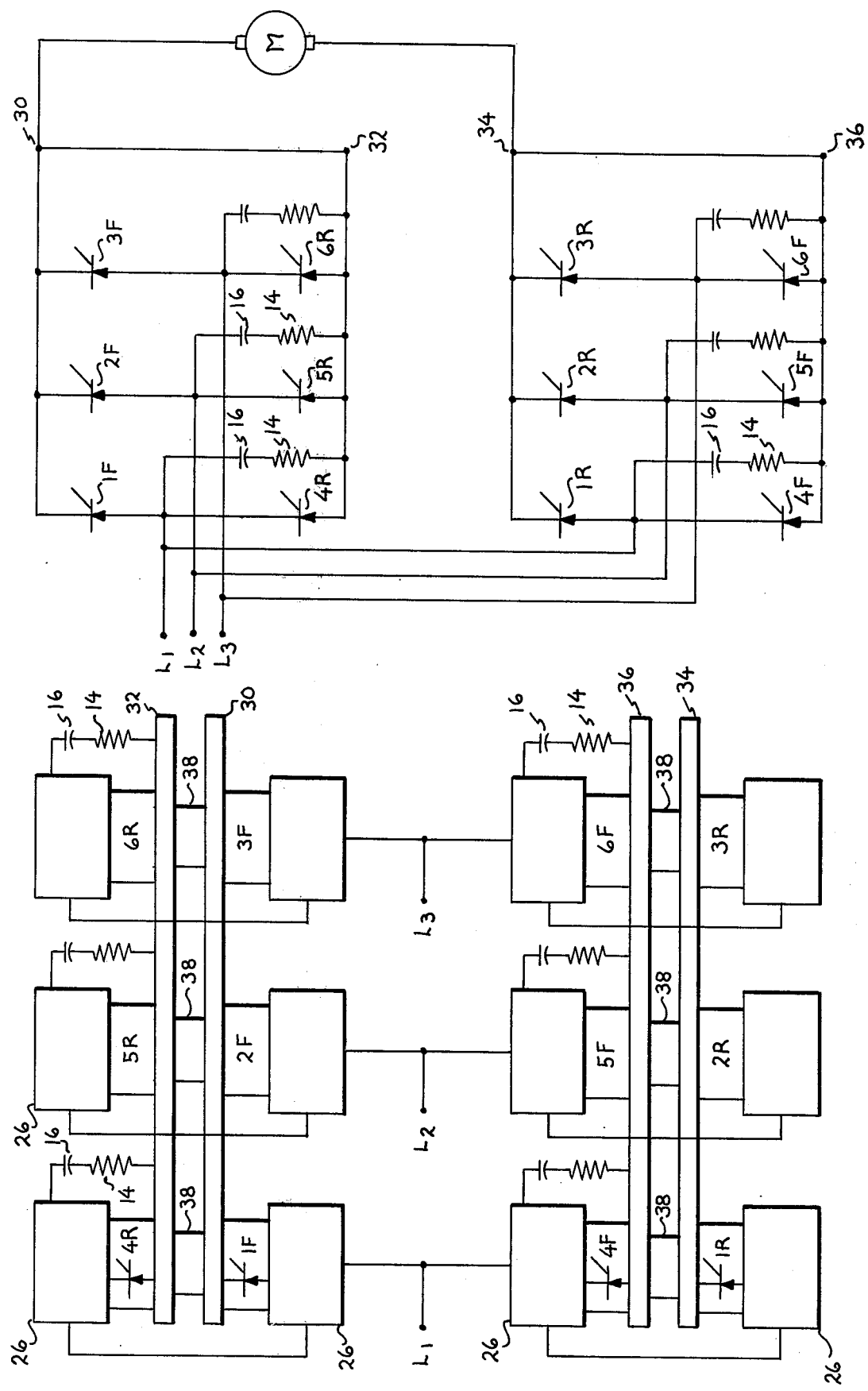

SEMICONDUCTOR AND HEAT SINK ASSEMBLY

BACKGROUND OF THE INVENTION

The present invention relates generally to heat sink arrangements for use in assemblies employing multiple semiconductor devices.

Because heat is one of the most common causes of semiconductor failure, in almost every application of semiconductor devices where any significant amount of power is being controlled, the semiconductors are mounted on or in a heat exchange relationship with some form of heat sink. These heat sinks often also form a part of the electrical circuitry. This is particularly true in the case of the flat package type of semiconductor device presently in widespread use. In this type of device, which is variously called a "pancake," "disc," "hockey puck" and one form of which sold by General Electric Company under the trademark "PRESS-PAK," the actual semiconductor material is retained between two flat conducting plates which constitute the anode and the cathode terminals. If the semiconductor device is other than a diode having only two electrodes, for example a thyristor, then the additional electrodes, such as a gate electrode, are elsewhere located for electrical connection. Because the heat sink is a part of the electrical circuitry, restrictions on construction are inherent. That is, because certain electrodes cannot be electrically connected, electrical insulation is required between various portions of the heat sink portion of the total assembly.

In many applications where a plurality of semiconductor devices collectively perform a unitary function, only a portion of the SCR devices are active or operational at any one particular instant in time. One example of such an operational package is the three phase, full wave, reversing bridge for driving a d.c. motor bidirectionally from an a.c. source. These bridges have two groups of semiconductors, one group for providing motor operation in the forward direction and a second group for providing motor operation in the reverse direction. Typically, when the bridges are of the phase control type, six thyristors are provided for forward motor operation and six for reverse operation. Customarily, the bridge is modularized and has the six forward thyristors connected as one unit and the six reverse thyristors as the second unit. Thus, if only a single direction drive is required, only one module is required.

In addition to the semiconductor devices and appropriate heat sinks, the total assembly usually also includes what are known as "snubber" circuits. Such circuits are well known and the snubber circuit is often no more than an RC network (e.g., a simple resistor and capacitor in series) which is connected in parallel with the semiconductor device. The primary purpose of the snubber circuit is one of protection. That is, the snubber circuit protects the semiconductor device from transients which might damage the device or cause a false firing thereof.

As earlier mentioned, one of the primary concerns with respect to semiconductor power apparatus is heat and thus the rating of any bridge assembly or similar type circuit is a function not only of the semiconductor devices themselves and their associated heat sinks but also of the manner in which the semiconductors are to be operated (i.e., the duty cycle). With a given semiconductor size, an increase in the duty cycle of the bridge will require greater heat dissipation capacity of the sink portion of the total assembly. In the prior art, once the design and cooling method were determined, increased capacity was usually achieved by increasing the heat sink size with the attendant increase in costs for material and packaging. In addition, the prior art requires individual snubber circuits for each of the semiconductor devices which also tends to raise the price of the overall apparatus or assembly.

SUMMARY OF THE INVENTION

It is, therefore, an object of the present invention to provide an improved semiconductor and heat sink assembly.

It is a further object to provide a semiconductor heat sink assembly with improved rating.

Another object is to provide a semiconductor heat sink assembly requiring a lesser amount of protective circuitry.

It is a still further object to maintain a unitary type assembly which permits a higher duty cycle for a given structure.

The foregoing and other objects are achieved, in accordance with the present invention through the provision of a semiconductor and heat sink assembly of the type having first and second groups of semiconductor devices in which only one of the groups is active or conducting at any particular instant in time. The heat sink portion of the assembly consists of a first heat sink member joining the anode terminals of a plurality of the semiconductors of the first group and the cathode terminals of a plurality of semiconductors of the second group with additional heat sink means of an individual nature connected to the free electrode terminals of each of the semiconductors of the first and second groups. A second unit similarly connected is provided to join the remaining semiconductor devices of the total circuit.

BRIEF DESCRIPTION OF THE DRAWING

While the present invention is defined in particularity in the claims annexed to and forming a part of this specification, a better understanding can be had from the following description taken in conjunction with the accompaning drawing in which:

FIG. 1a is an electrical schematic of a three phase, full wave, thyristor reversing drive in accordance with the prior art;

FIG. 1b is a mechanical/electrical schematic of the bridge shown in FIG. 1a, again in accordance with the prior art, and illustrating the heat sink assembly associated with the electrical circuitry there shown;

FIGS. 2a and 2b are, respectively, showings corresponding in type to FIGS. 1a and 1b but illustrating a full wave reversing drive in accordance with the present invention; and, FIGS. 3a and 3b illustrate the application of the present invention to a single phase, full wave, regenerative motor drive.

DETAILED DESCRIPTION

Figures 3A, 3B:
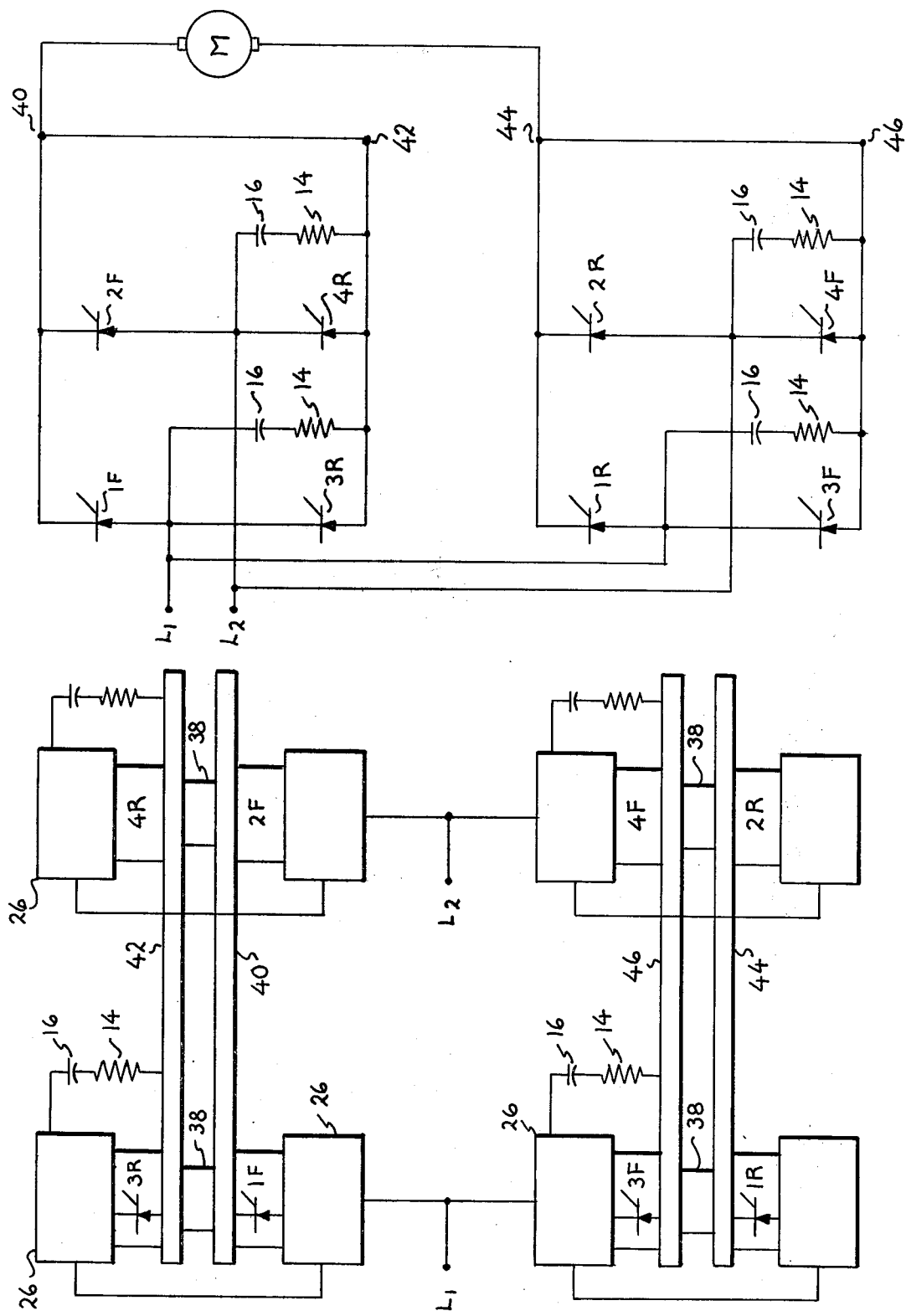

In order that the present invention may be better understood, it is believed advantageous to first review a typical prior art type bridge or power conversion unit. FIG. 1a shows an electrical schematic diagram for a state-of-the-art three phase, full wave, reversing drive for supplying a d.c. motor M from a three phase source indicated by the terminals $L_1$, $L_2$ and $L_3$. The bridge of FIG. 1a is shown having six thyristors for forward direction operation and six thyristors for the reverse direction operation but it is also to be understood that diodes could be used where appropriate. The forward bridge, indicated generally at 10, has six thyristors 1F, 2F, 3F, 4F, 5F and 6F and a pair of d.c. output terminals 18 and 20 across which the motor M is connected. The three a.c. source phases $L_1$, $L_2$ and $L_3$ are individually connected, respectively, to the thyristor pairs 1F–4F, 2F–5F and 3F–6F. In order to protect the thyristors from transients and to aid in the firing of these thyristors in a manner well known in the art, there is connected in parallel with each of the thyristors 1F through 6F a snubber circuit which is shown in its simplest form and includes a resistor 14 in series with a capacitor 16. The reverse bridge 12 is substantially identical to the forward bridge 10 and includes six thyristors 1R through 6R, each of which has an associated, parallel connected snubber circuit including a resistor 14 in series with a capacitor 16. The motor M is connected across the d.c. output terminals 22 and 24 of the reverse bridge 12. Motor operation in the first direction, here arbitrarily designated the forward direction, occurs when the thyristors of bridge 10 are rendered conductive at the appropriate points within the a.c. cycle. Conversely, when motor direction in the opposite or reverse direction is desired, bridge 12 is rendered operative.

FIG. 1b illustrates the mechanical/electrical schematic equivalent of the circuit shown in FIG. 1a in accordance with the prior art. In FIG. 1b, the six thyristors 1F through 6F of the forward bridge are connected in a unitary heat sink assembly such that each of the three thyristors 1F, 2F and 3F is in contact with a conducting member 18, which may be in the form of a flat conducting bar (e.g., aluminum) to form a common cathode terminal connection of each of these three thyristors. The anodes of these three thyristors are connected to individual heat sink assemblies 26 which may be, for example, of a fin type structure as is illustrated at the left hand side of FIG. 1b. A snubber circuit 14–16 is connected between the common conductor 18 and each of the individual heat sink assemblies 26. In a similar manner, thyristors 4F through 6F have their anodes connected to a common bus heat sink assembly member 20, which may be a bar similar to bar 18. The cathodes of the thyristors 4F–6F are each connected to an individual heat sink member 26. Snubber circuits are also connected in parallel with each of these thyristors. The two heat sink assemblies 26 associated with each of the thyristor pairs 1F–4F, 2F–5F and 3F–6F are electrically joined. From this, as is better seen when viewed in conjunction with FIG. 1a, the individual heat sink members 26 form the a.c. side of the bridge while the bars or common members 18 and 20 form the d.c. side (i.e., corresponding to the terminal points 18 and 20 shown in FIG. 1a). Bars 18 and 20 are maintained electrically isolated one from the other by means of suitable insulating spacers 28.

The lower depiction of FIG. 1b corresponds to the reverse bridge 12 and is substantially identical in structure and appearance to the upper portion and like components have been given like designations. Beyond pointing out the correspondence of terminals 22 and 24 (FIG. 1a) to the bars 22 and 24 (FIG. 1b), further description is believed unnecessary.

As shown by FIGS. 1a and 1b, in the prior art type assembly operation in the forward direction involves the use of the upper depiction of FIG. 1b while operation in the reverse direction employs the assembly shown in the lower portion of FIG. 1b. Thus, during operation, each of the thyristors associated with an assembly generates heat and contributes to the overall heat of the assembly. As such, while operating in the forward direction for example, the upper portion of FIG. 1b would become relatively hot while the lower portion would remain at ambient temperature. The reverse would be true for operation in the reverse direction.

FIGS. 2a and 2b correspond in type to FIGS. 1a and 1b and illustrate the present invention in its preferred embodiment as applied to the three phase, full wave, reversing bridge. Insofar as is appropriate, the same designations are used in FIGS. 2a and 2b as were used with respect to FIGS. 1a and 1b. Referring now to FIG. 2a, it is seen that, although the general configuration is similar to that shown in FIGS. 1a, the upper portion of the bridge here includes thyristors from both the forward and the reverse portions of the bridge. The same is true for the lower bridge portion. Specifically, it is seen that the lines of the three phase source, once again represented by the lines $L_1$, $L_2$ and $L_3$, are connected, respectively, in the upper portion of the bridge to the anodes of the thyristors 1F, 2F and 3F and to the cathodes of the thyristors 4R, 5R and 6R. Similarly, in the lower portion, lines $L_1$, $L_2$ and $L_3$ are connected, respectively, to the anodes of thyristors 1R, 2R and 3R and to the cathodes of the thyristors 4F, 5F and 6F. The cathodes of the thyristors 1F through 3F are connected to the common d.c. terminal 30 which is, in turn, connected to the common terminal 32 and the anodes of the thyristors 4R through 6R. Terminal 30 is further connected to one side of the motor M. The other side of the motor M is connected to a d.c. terminal 34 which is connected to the cathodes of the three thyristors 1R through 3R and this terminal is further connected to the d.c. terminal 36 which forms a connection to the anodes of the three thyristors 4F through 6F. As is shown, because of this particular electrical configuration, the number of snubber circuits required may be reduced by one-half and it is necessary, in this case, to provide only six snubbers instead of twelve as was the prior art case. In that a forward thyristor, for example thyristor 1F, cannot be conducting at the same time as the corresponding reverse thyristors of a pair (thyristor 4R), the single snubber circuit is effectively connected in parallel with each of these thyristors and will thus serve as a snubber circuit for both.

The physical arrangement of the thyristors of the bridge shown in FIG. 2a with respect to the semiconductor heat sink assembly is illustrated in FIG. 2b. A comparison of FIGS. 1b and 2b clearly demonstrates that very little change is required in existing assemblies to achieve the present invention. The first significant difference noted is that in the present invention there is an intermixing of the thyristors of the forward and reverse bridges. As shown in the upper portion of FIG. 2b, three reverse thyristors 4R through 6R have their anodes connected to the heat sink bus or common terminal 32 while the three forward thyristors 1F through 3F have their cathodes connected to the heat sink bus or common terminal 30. Similarly, in the lower portion of FIG. 2b, thyristors 4F through 6F are connected with their anodes in contact with the heat sink bus 36 and the thyristors 1R through 3R have their cathodes connected to the heat sink bus 34. As before, individual heat sink members, which may be of the finned type as illustrated in FIG. 1b, are connected to the free sides of each of the thyristors and the individual heat sink assemblies 26 of each thyristor pair (e.g., pair 1F and 4R) are electrically connected.

The next significant difference between the FIG. 1b and FIG. 2b assemblies concerns the spacing elements 38 between the heat sink bus bars 30, 32 and 34, 36. Whereas in the prior art assembly of FIG. 1b, the spacers 28 were of insulating material, in the present situation these spacers are of a conductive material, both electrical and heat. Thus, it is apparent that, although spacers are used in this particular embodiment to demonstrate the ability to use the same basic type structure as was used in the prior art, the bus bars 30 and 32 could be a single unit. The use of the dual bus bar structure shown does, however, permit commonality of design and also improves heat dissipation by allowing the cooling medium to circulate between the bars.

Still with reference to FIG. 2b, it is seen that the present invention will permit a more severe duty cycle for a given size and design of heat sink. Assume first that the motor of FIG. 2a is being run in the forward direction such that the thyristors 1F through 6F are operational. Using thyristor 1F as an example, the heat appearing at its anode will be directly dissipated by the individual heat sink member 26. The heat at its cathode, however, is transmitted to the bar bus 30, thence through the conducting spacer 38 to the bar 32. From bar 32, heat has a path by way of the thyristors 4R–6R to the respective members 26 associated with those thyristors, the primary path being, in this example, through thyristor 4R. It has been found that this path from one electrode to the heat sink 26 associated with the other thyristor of the pair approximates the direct path to the individual heat sink 26 associated with the other electrode of a thyristor. From the foregoing, it is seen that by this structure and arrangement the heat dissipating capacity of a given thyristor bridge assembly is greatly enhanced in that at any one time only a half of the thyristors associated with a physical structure are operating and generating heat while the full capability of the structure from the heat dissipation standpoint is operative. Stated in another way, with a given heat sink assembly, the duty cycle of the bridge may be increased without heat damage to the bridge semiconductors. The additional advantage of a reduction in the required number of snubber circuits has already been mentioned.

FIGS. 3a and 3b illustrate the application of the present invention to a single phase, full wave, reversing or regeneration bridge. These depictions are very similar to those of FIGS. 2a and 2b with the primary distinction being that the forward and reverse (regeneration) bridges employ only four semiconductor devices each as opposed to the six as shown in FIGS. 2a and 2b. Looking at the bridges from an overall viewpoint, it is seen that the d.c. sides of the bridge are indicated by terminal 40 (common with terminal 42) and terminal 44 (common with terminal 46). In FIG. 3b, these terminals are again shown as bus bars. Spacers 38 are, as before, electrically and heat conductive.

Thus, it is seen that there have been shown and described readily manufacturable semiconductor and heat sink assemblies which take advantage of known structures and yet provide improved operational capabilities.

While there have been shown and described what are at present considered to be the preferred embodiments of the present invention, modifications thereto will readily occur to those skilled in the art. It is not desired, therefore, that the invention be limited to the specific circuits shown and described and it is intended to cover in the appended claims all such modifications as fall within the true spirit and scope of the invention.

What is claimed is:

1. A semiconductor and heat sink assembly having first and second groups of semiconductors, each semiconductor having an anode terminal and a cathode terminal, said first group being active and said second group being inactive in a first mode of circuit operation and said second group being active with said first group being inactive in a second mode of circuit operation, said assembly comprising:
   (a) a first electrically conductive heat sink unit joining the anode terminals of a first portion of the semiconductors of said first group and the cathode terminals of a first portion of the semiconductors of said second group;
   (b) a second electrically conductive heat sink unit joining the cathode terminals of a second portion of the semiconductors of said first group and the anode terminals of a second portion of the semiconductors of said second group; and,
   (c) a plurality of additional heat sink members one of which is connected to the free electrode terminals of each of the semiconductors of said first and second groups.

2. The invention in accordance with claim 1 wherein said first and second heat sink units each comprises first and second electrically and heat conducting bar members in contact with the anode and cathode terminals of the respective groups of semiconductors and means to connect said bars electrically and for heat transfer.

3. A semiconductor power assembly employing first and second groups of semiconductors, each semiconductor having an anode terminal and a cathode terminal, in which only one of the groups is active at a given time and in which each semiconductor of the first group has a corresponding semiconductor in the second group to form a semiconductor pair, the assembly comprising:
   (a) a first electrically conductive heat sink unit joining the anode terminals of a first portion of the semiconductors of said first group and the cathode terminals of a first portion of the semiconductors of said second group;
   (b) a second electrically conductive heat sink unit joining the cathode terminals of a second portion of the semiconductors of said first group and the anode terminals of a second portion of the semiconductors of said second group;
   (c) an additional individual heat sink means connected to the free electrode terminals of each of the semiconductors of said first and second groups;
   (d) means to electrically connect the individual heat sink means of a semiconductor pair; and
   (e) a single snubbing circuit for each semiconductor pair connected between an individual heat sink member and an associated one of said first and second heat sink units.

4. The invention in accordance with claim 3 wherein said first and second heat sink units each comprises first and second electrically and heat conducting bar members in contact with the anode and cathode terminals of the respective groups of semiconductors and means to connect said bars electrically and for heat transfer.

* * * * *